United States Patent
Cai et al.

(10) Patent No.: US 12,388,053 B2
(45) Date of Patent: Aug. 12, 2025

(54) DISPLAY DEVICE

(71) Applicant: AUO Corporation, Hsin-Chu (TW)

(72) Inventors: Jeng-Lin Cai, Hsin-Chu (TW);
Chung-Hsien Hsu, Hsin-Chu (TW);
Ming-Hung Tu, Hsin-Chu (TW);
Ya-Fang Chen, Hsin-Chu (TW);
Chih-Hsiang Yang, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 563 days.

(21) Appl. No.: 17/862,827

(22) Filed: Jul. 12, 2022

(65) Prior Publication Data

US 2023/0207536 A1 Jun. 29, 2023

(30) Foreign Application Priority Data

Dec. 23, 2021 (TW) ................................ 110148504

(51) Int. Cl.
*H01L 25/075* (2006.01)
*H10H 20/857* (2025.01)

(52) U.S. Cl.
CPC ....... *H01L 25/0753* (2013.01); *H10H 20/857* (2025.01)

(58) Field of Classification Search
CPC . H01L 25/0753; H10H 20/857; G09F 9/3023; G09F 9/33; G09G 3/14; G09G 3/32
See application file for complete search history.

(56) References Cited

U.S. PATENT DOCUMENTS

| | | | |
|---|---|---|---|
| 11,282,786 B2* | 3/2022 | Radauscher | H01L 23/5254 |
| 2012/0146981 A1* | 6/2012 | Lau | G09G 3/20 |
| | | | 345/82 |
| 2014/0369042 A1 | 12/2014 | Hsu | |
| 2015/0176820 A1* | 6/2015 | Abe | F21V 19/0025 |
| | | | 362/249.14 |
| 2020/0194370 A1* | 6/2020 | Radauscher | H01L 23/528 |
| 2021/0043616 A1 | 2/2021 | Jung | |
| 2022/0302175 A1* | 9/2022 | Shin | H10D 86/60 |
| 2023/0028746 A1* | 1/2023 | Yang | G09G 3/3258 |
| 2023/0139020 A1* | 5/2023 | Xiao | H01L 25/0753 |
| | | | 362/97.1 |
| 2023/0387139 A1* | 11/2023 | Lei | H01L 25/0753 |
| 2024/0312965 A1* | 9/2024 | Ma | H01L 23/34 |

FOREIGN PATENT DOCUMENTS

| | | |
|---|---|---|
| CN | 202889784 U | 4/2013 |
| CN | 112582442 A | 3/2021 |

* cited by examiner

*Primary Examiner* — Victor A Mandala
(74) *Attorney, Agent, or Firm* — WPAT, PC

(57) ABSTRACT

The present disclosure provides a display device, including first to fourth LEDs, a line structure, and first to fourth lines. The second LED is arranged in a first direction corresponding to the first LED. The fourth LED is arranged in a second direction corresponding to the third LED. The line structure includes first to third line segments. The first line is coupled to the first LED. The second line is coupled to the second LED. The third line is coupled to the third LED. The fourth line is coupled to the fourth LED. A portion of the first line and a portion of the second line are in parallel with the first line segment, a portion of the third line is in parallel with the second line segment, and a portion of the fourth line is in parallel with the third line segment.

20 Claims, 8 Drawing Sheets

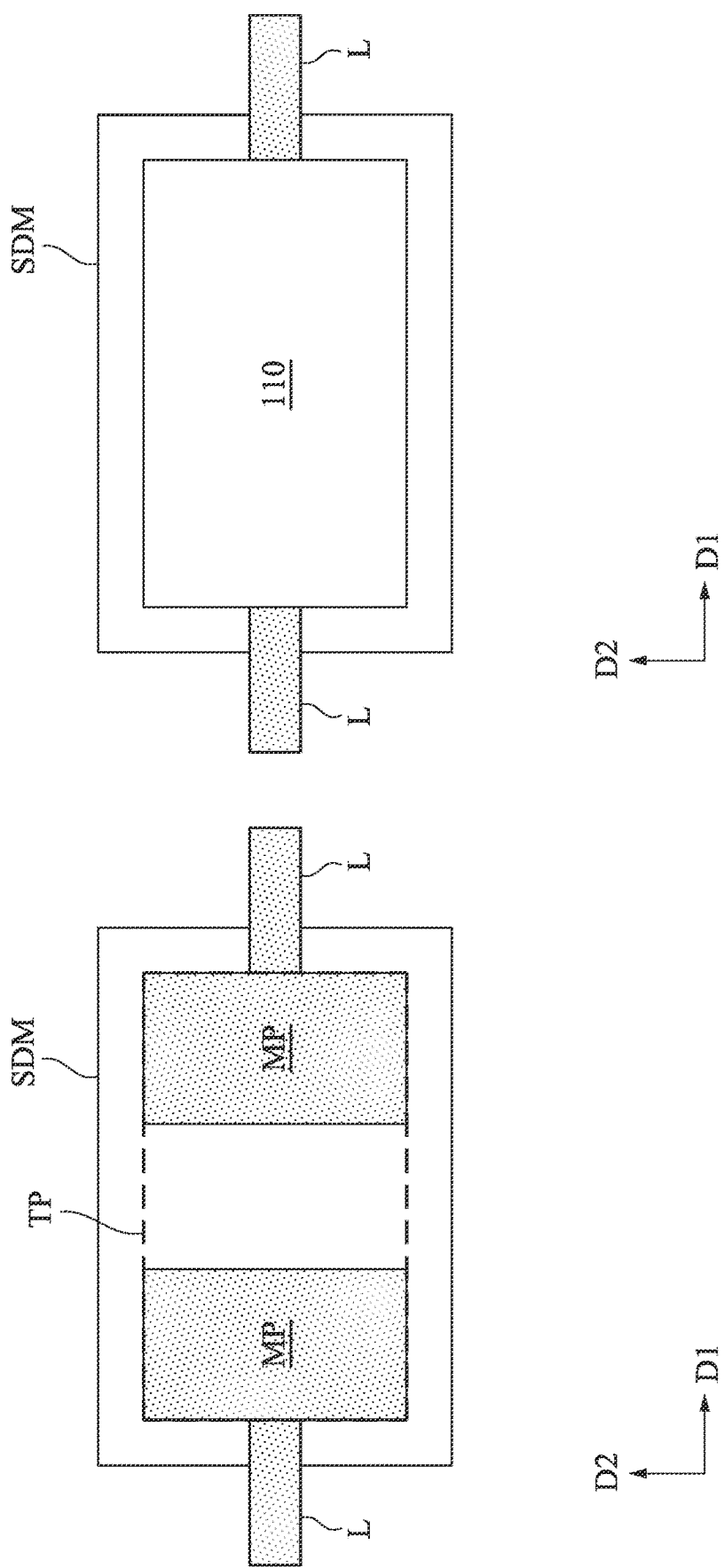

DISPLAY DEVICE

CROSS-REFERENCE TO RELATED APPLICATION

This application claims priority to Taiwan Application Serial Number 110148504, filed Dec. 23, 2021, which is herein incorporated by reference in its entirety.

BACKGROUND

Field of Invention

The present disclosure relates to a display device. More particularly, the present disclosure relates to a display device that includes a line structure.

Description of Related Art

In the process of manufacturing displays, if the lines in the solder mask are perpendicular to the electrodes of the light emitting diodes (LEDs), the LEDs can be attracted by solder and deviate from predetermined fixation positions during soldering, causing poor yield rate. In addition, when the polarities of multiple LEDs are not well-organized, arrangement of lines can be complicated and more vias are required, and thus more raw materials are consumed.

SUMMARY

The present disclosure provides a display device, including a first LED, a second LED, a third LED, a fourth LED, a line structure, a first line, a second line, a third line, and a fourth line. The second LED is arranged in a first direction corresponding to the first LED. The fourth LED is arranged in a second direction corresponding to the third LED, and the third LED and the fourth LED are arranged between the first LED and the second LED, wherein the second direction is different from the first direction. The line structure includes a first line segment, a second line segment, and a third line segment, wherein the first line segment extends along the first direction and couples the first LED to the second LED, the second line segment is coupled to the third LED, and the third line segment is coupled to the fourth LED. The first line is coupled to the first LED. The second line is coupled to the second LED. The third line is coupled to the third LED. The fourth line is coupled to the fourth LED. A portion of the first line and a portion of the second line are in parallel with the first line segment, a portion of the third line is in parallel with the second line segment, and a portion of the fourth line is in parallel with the third line segment.

The present disclosure also provides a display device, including multiple light emitting units. Each of the light emitting units includes a first LED, a second LED, a third LED, a fourth LED, and multiple line structures. The first LED, the second LED, the third LED, and the fourth LED are respectively arranged at up, down, left, and right positions in a plane, such that the light emitting units include first LEDs, second LEDs, third LEDs, and fourth LEDs. Each of the line structures is coupled to electrodes of the first LED, the second LED, the third LED, and the fourth LED in a corresponding light emitting unit of the light emitting units. The electrodes have the same polarities. Each of the line structures includes a first line segment, a second line segment, a third line segment, a first line, a second line, a third line, and a fourth line. The first line segment couples the third LED to the fourth LED, the second line segment is coupled to the first LED, and the third line segment is coupled to the second LED. The first line couples the first LEDs of the light emitting units with each other. The second line couples the second LEDs of the light emitting units with each other. The third line couples the third LEDs of the light emitting units with each other. The fourth line couples the fourth LEDs of the light emitting units with each other.

BRIEF DESCRIPTION OF THE DRAWINGS

The invention can be more fully understood by reading the following detailed description of the embodiment, with reference made to the accompanying drawings as follows:

FIG. 2A is a diagram of a target fixation position on a PCB in accordance with some embodiments of the present disclosure.

FIG. 2B is a diagram of a target fixation position on a PCB in accordance with some embodiments of the present disclosure.

DETAILED DESCRIPTION

Figure 1B:
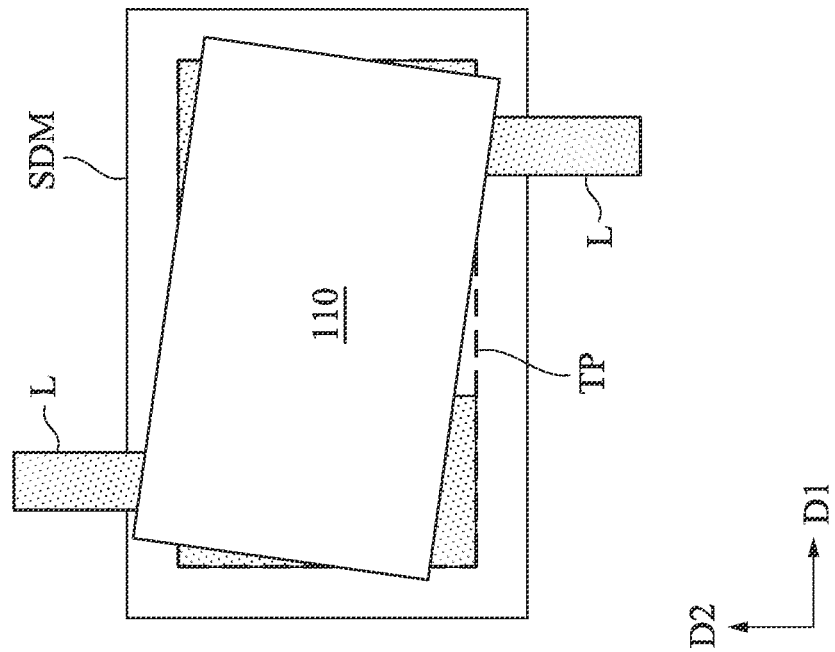
FIG. 1B is a diagram of a target fixation position on a PCB.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification generally have their ordinary meanings in the art, within the context of the invention, and in the specific context where each term is used.

As used in the present disclosure, the terms "comprising," "including," "having," "containing," "involving," and the like are to be understood to be open-ended, i.e., to mean including but not limiting to. In addition, as used in the present disclosure, the term "and/or" includes any and all combinations of one or more of the associated listed items. Moreover, it will be understood that, although the terms "first," "second," etc., may be used herein to describe various elements, these elements should not be limited by these terms. These terms are used to distinguish one element from another.

In some examples, for manufacturing display devices, when light emitting diodes (LEDs) are being fixed onto a printed circuit board (PCB), the fixation of LEDs will be affected by the positions of lines arranged on the PCB. Specifically, parts of the lines on the PCB are not covered by solder mask, so when solder is melted to fix the LEDs on the PCB, the solder will be drawn by the uncovered lines, and the LED will deviate from its planned location.

Figure 1A:
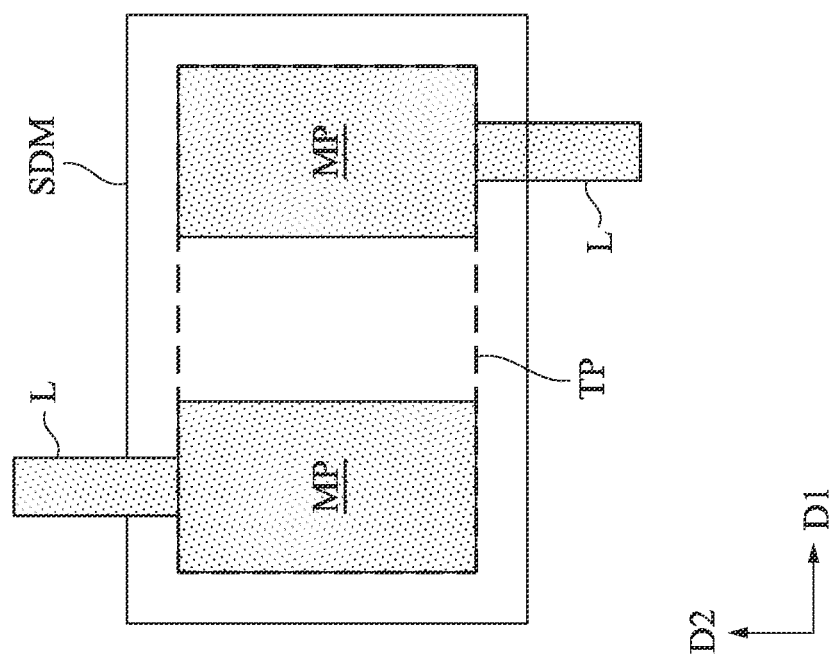
FIG. 1A is a diagram of a target fixation position on a printed circuit board (PCB).

Please refer to FIG. 1A. FIG. 1A is a diagram of a target fixation position on a PCB. In some examples, as shown in FIG. 1A, a PCB area includes metal portions MP, lines L, and a solder mask SDM. The metal portions MP are configured to electrically connect to different electronic components, such as LEDs. When the anode and cathode of an electronic component are respectively connected to the two metal portions MP, the electronic component is then coupled to the other electronic component or receives certain voltage or signals through the lines L, so that the electronic component will perform its predetermined function according to the circuit configuration of the PCB. The solder mask SDM is configured to cover part of the PCB to prevent the solder from being applied to the PCB and affecting the PCB's function. In FIG. 1A, the metal portions MP and the lines L are configured to connect the LED and thus are not covered by the solder mask SDM. In some examples, solder is applied between the metal portions MP and the electrodes of the LED, and then solder is heated and melted, such that the metal portions MP and the electrodes of the LED become electrically connected, and the fixation of the LED is done.

In the example shown in FIG. 1A, the LED is planned to be fixed at a target position TP, such that the anode and cathode of the LED will be fixed on the metal portions MP respectively. In some examples, as shown in FIG. 1A, the two lines L extend along a second direction D2 and are respectively connected to the corresponding metal portions MP. As described above, during the process of fixing the LED at the target position TP, the solder will be drawn by the lines L, causing the position of the LED does not match the target position TP. Please refer to FIG. 1B. FIG. 1B is a diagram of a target fixation position on a PCB. In some examples, when an LED 110 is being fixed at the target position TP shown in FIG. 1A, a skewing situation as shown in FIG. 1B can happen. The two lines L connect to the metal portions respectively along the second direction D2 and the direction opposite to the second direction D2, and the LED 110 is subjected to attractions from the two lines L during fixation, so the skewing of the LED 110 as shown in FIG. 1B happens.

Figure 1D:
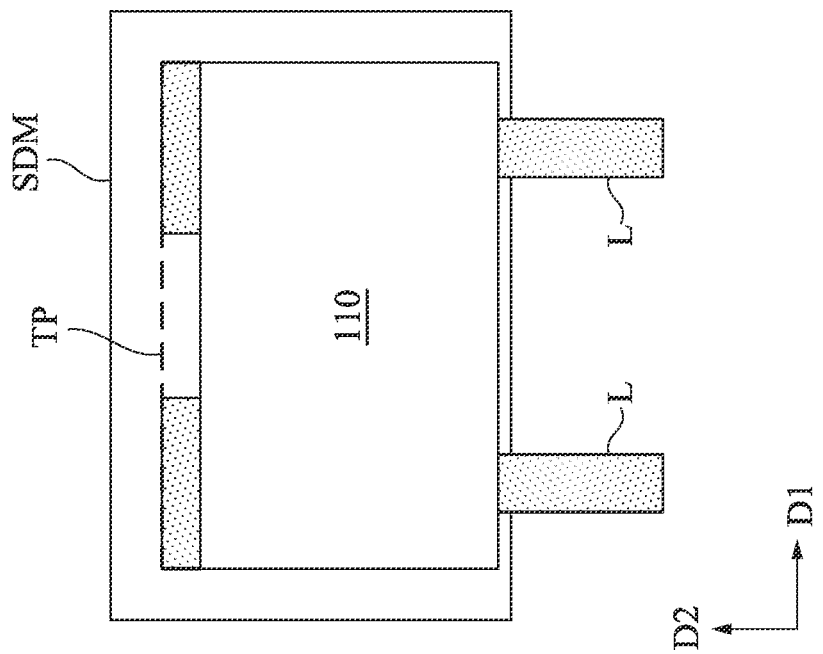
FIG. 1D is a diagram of a target fixation position on a PCB.
Figure 1C:
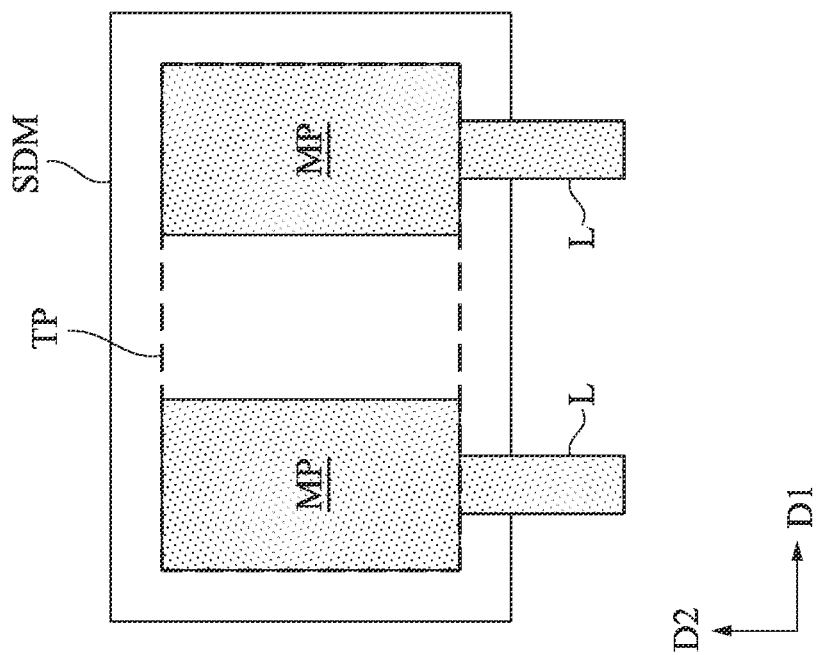
FIG. 1C is a diagram of a target fixation position on a PCB.

Please refer to FIG. 1C. FIG. 1C is a diagram of a target fixation position on the PCB. In another example, both of the lines L are connected to the metal portions MP along the second direction D2. In this example, the position of the LED will be likewise affected by the lines L, and skewing will happen. Please refer to FIG. 1D. FIG. 1D is a diagram of a target fixation position on the PCB. As shown in FIG. 1D, the LED 110 is deviated from the target position TP and shifted toward the lines L.

In some embodiments of the present disclosure, the lines are arranged on the two opposite sides of the LED in order to prevent or alleviate the skewing of the LED as described in the previous examples. Please refer to FIG. 2A. FIG. 2A is a diagram of a target fixation position on a PCB in accordance with some embodiments of the present disclosure. The two lines L are connected to the corresponding metal portions MP respectively along the first direction D1 and the direction that is opposite to the first direction D1. In other words, the lines L extend from the metal portions MP toward the left side and the right side of FIG. 2A. In such configuration, the attractions that the LED will be subjected from the lines L during fixation are of opposite directions and thus will be offset.

Please refer to FIG. 2B. FIG. 2B is a diagram of a target fixation position on a PCB in accordance with some embodiments of the present disclosure. In some embodiments, due to the positions of the lines L as shown in FIG. 2A, the LED 110 being fixed on the PCB can match the target position TP. In some embodiments, in the configuration shown in FIGS. 2A and 2B, the attractions from the lines L might not be completely offset, so the LED 110 may not match the target position TP completely. However, compared with examples in FIGS. 1A, 1B, 1C, and 1D, the configuration of lines in FIGS. 2A and 2B can still make the LED 110 better match the target position TP.

Figure 3A:
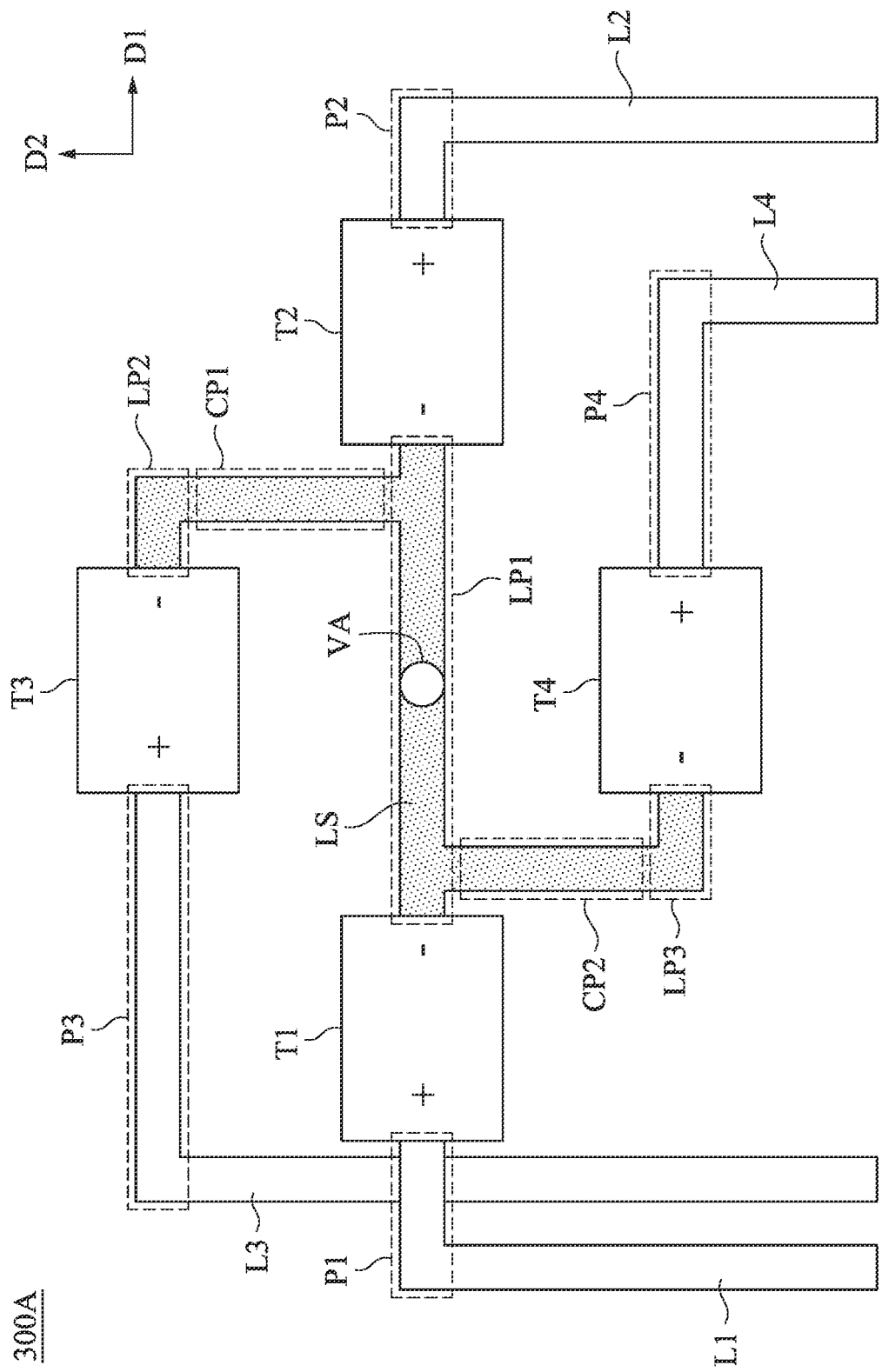
FIG. 3A is a diagram of a light emitting unit in a display device in accordance with some embodiments of the present disclosure.

One embodiment of the present disclosure provides a light emitting unit in a display device, such as a light emitting unit 300A shown in FIG. 3A. The light emitting unit includes the technical features of the embodiments in FIGS. 2A and 2B that have been described above. Please refer to FIG. 3A. FIG. 3A is a diagram of a light emitting unit 300A in a display device in accordance with some embodiments of the present disclosure. The light emitting unit 300A includes LEDs T1, T2, T3, and T4, a line structure LS, and lines L1, L2, L3, and L4. The LEDs T1-T4 are configured to receive voltages from their anodes and cathodes and emit light, and the line structure LS is configured to couple the LEDs T1-T4 with each other and provide reference voltages to the LEDs T1-T4.

In some embodiments, the line structure LS is coupled to the electrodes of the LEDs T1-T4, and the electrodes have the same polarities. In some embodiments, as shown in FIG. 3A, the line structure LS is coupled to the cathodes of the LEDs T1-T4 and is configured provide a reference voltage to the cathodes of the LEDs T1-T4, and the lines L1-L4 are configured to provide voltages to the anodes of the LEDs T1-T4 respectively. In other words, the cathodes of the LEDs T1-T4 are coupled with each other and receive the same reference voltage, and thus the light emitting unit 300A is a common-cathode structure.

As shown in FIG. 3A, the LEDs T1 and T2 are arranged correspondingly in the first direction D1, and the LEDs T3 and T4 are arranged correspondingly in the second direction D2 different from the first direction D1 and are arranged between the LEDs T1 and T2 in the first direction D1.

The LEDs T1-T4 are all connected to the line structure LS. Specifically, the line structure LS includes line segments LP1, LP2, and LP3, and connecting line segments CP1 and CP2. The line segment LP1 extends along the first direction D1 and couples the LEDs T1 and T2 with each other, and the line segment LP1 is arranged between the LEDs T3 and T4 in the second direction D2. The line segment LP2 couples the cathode (denoted by "−" in FIG. 3A) of the LED T3 to the connecting line segment CP1, and the connecting line segment CP1 is further coupled to the line segment LP1. In one embodiment, the line segment LP2 is in parallel with the first direction D1, and the connecting line segment CP1 is coupled to the line segment LP1 along the second direction D2 that is perpendicular to the first direction DE Similarly, the line segment LP3 couples the cathode of the LED T4 to the connecting line segment CP2, and the connecting line segment CP2 is further coupled to the line segment LP1. In one embodiment, the line segment LP3 is in parallel with the first direction D1, and the connecting line segment CP2 is coupled to the line segment LP1 along the second direction D2 that is perpendicular to the first direction D1.

In one embodiment, the light emitting unit 300A further includes a connecting piece VA, and the connecting piece VA is configured to couple the LEDs T1-T4 to the reference voltage. In one embodiment, the connecting piece VA is a via that penetrates at least one layer of the PCB, and the connecting piece VA is further coupled to the reference voltage through additional lines or connecting structure. In the embodiment shown in FIG. 3A, the connecting piece VA is configured to provide a relatively low voltage or ground voltage to the cathodes of the LEDs T1-T4.

Through the configuration and coupling relationship described above, the line structure LS couples the LEDs T1-T4 with each other and provides the reference voltage received from the connecting piece VA to the cathodes of the LEDs T1-T4.

In the embodiment of FIG. 3A, the line L1 is coupled to the anode (denoted by "+" in FIG. 3A) of the LED T1, the line L2 is coupled to the anode of the LED T2, the line L3 is coupled to the anode of the LED T3, and the line L4 is coupled to the anode of the LED T4. The line L1 includes a portion P1, the line L2 includes a portion P2, the line L3 includes a portion P3, and the line L4 includes a portion P4. In one embodiment, the portions P1-P4 are in parallel with the first direction DE In one embodiment, the lines L1-L4 are configured to receive a voltage (not shown in FIG. 3A) that is relatively higher than the reference voltage received by the line structure LS and to transmit such higher voltage to the anodes of the LEDs T1-T4, so that there will be enough voltage differences between the anode and cathode of each of the LEDs T1-T4, and that the LEDs T1-T4 can emit light.

According to the description above, like the embodiments in FIGS. 2A and 2B, each of the LEDs T1-T4 in FIG. 3 is connected to two lines that extend toward the opposite directions respectively. Therefore, when the LEDs T1-T4 are being fixed onto the PCB, excessive skewing of the LEDs T1-T4 due to the positions of lines can be avoided. Specifically, the anode of the LED T1 is coupled to the portion P1 of the line L1, and the cathode of the LED T1 is coupled to the line segment LP1. Because the portion P1 and the line segment LP1 are both in parallel with the first direction D1 and are respectively on the left and right sides of the LED T1, the attractions which the LED T1 is subjected to from the portion P1 and the line segment LP1 can be offset. Similarly, each of the LEDs T2-T4 is connected to two lines that extend toward left and right sides respectively, so skewing of the LEDs T2-T4 can be avoided.

In one embodiment, the line segments LP1-LP3 and the connecting line segments CP1 and CP2 of the line structure LS are arranged in the same layer of the PCB, and thus the line structure LS can be manufactured through only one or a few manufacturing process, and the structure of the light emitting unit 300A can be simple.

In one embodiment, a direction from the anode of the LED T1 to the cathode of the LED T1 (i.e., the anode-to-cathode direction of the LED T1) is opposite to a direction from the anode of the LED T2 to the cathode of the LED T2 (i.e., the anode-to-cathode direction of the LED T2), and a direction from the anode of the LED T3 to the cathode of the LED T3 (i.e., the anode-to-cathode direction of the LED T3) is opposite to a direction from the anode of the LED T4 to the cathode of the LED T4 (i.e., the anode-to-cathode direction of the LED T4). For example, in the embodiment of FIG. 3A, the direction from the anode of the LED T1 to the cathode of the LED T1 and the direction from the anode of the LED T3 to the cathode of the LED T3 are both the first direction D1, and the direction from the anode of the LED T2 to the cathode of the LED T2 and the direction from the anode of the LED T4 to the cathode of the LED T4 are opposite to the first direction DE By this configuration, fewer lines and/or via materials are required to connect the LEDs T1-T4 through the line structure LS.

In an alternative embodiment, the direction from the anode of the LED T1 to the cathode of the LED T1 is opposite to the direction from the anode of the LED T2 to the cathode of the LED T2, but the direction from the anode of the LED T3 to the cathode of the LED T3 is the same as the direction from the anode of the LED T4 to the cathode of the LED T4. For example, the direction from the anode of the LED T1 to the cathode of the LED T1, the direction from the anode of the LED T3 to the cathode of the LED T3, and the direction from the anode of the LED T4 to the cathode of the LED T4 are the first direction D1, and only the direction from the anode of the LED T2 to the cathode of the LED T2 is opposite to the first direction DE In this embodiment, it is still possible to use a line structure located between the LEDs T1-T4 to couple the cathodes of the LEDs T1-T4 with each other. However, because the direction from the anode of the LED T3 to the cathode of the LED T3 and the direction from the anode of the LED T4 to the cathode of the LED T4 are the same, both of the lines connected to the anodes of the LEDs T3 and T4 have to be arranged at the relatively left part in FIG. 3A, but there can be no enough space for these two lines, or the two lines will have to be arranged in different layers of the PCB.

Figure 3B:
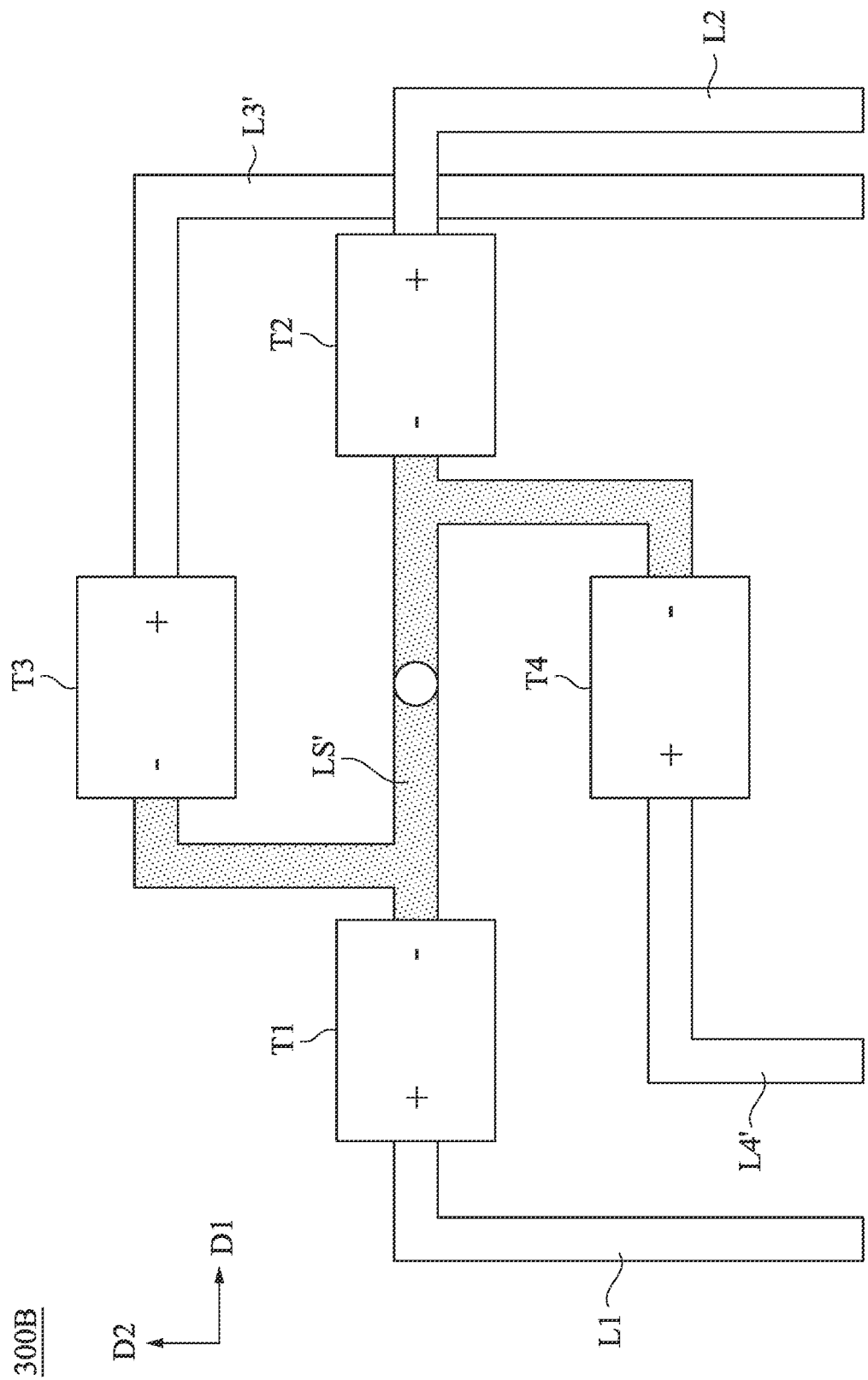
FIG. 3B is a diagram of a light emitting unit in a display device in accordance with some embodiments of the present disclosure.

In one embodiment, the direction from the anode of the LED T1 to the cathode of the LED T1 and the direction from the anode of the LED T4 to the cathode of the LED T4 are the first direction D1, and the direction from the anode of the LED T2 to the cathode of the LED T2 and the direction from the anode of the LED T3 to the cathode of the LED T3 are opposite to the first direction DE Please refer to FIG. 3B. FIG. 3B is a diagram of a light emitting unit 300B in a display device in accordance with some embodiments of the present disclosure. The light emitting unit 300B has components that are similar to the ones that the light emitting unit 300A has. These components include the LEDs T1-T4, the line structure LS', and the lines L1, L2, L3', and L4'. However, the polarities of the LEDs in the light emitting unit 300B are not exactly the same as the ones in the light emitting unit 300A. In the light emitting unit 300B, the direction from the anode of the LED T3 to the cathode of the LED T3 is opposite to the first direction D1, and the direction from the anode of the LED T4 to the cathode of the LED T4 is the first direction D1, which are opposite to the polarities of the LEDs T3 and T4 in the light emitting unit 300A. Yet, the light emitting unit 300B still possesses the technical features that the direction from the anode of the LED T1 to the cathode of the LED T1 is opposite to the direction from the anode of the LED T2 to the cathode of the LED T2, and that the direction from the anode of the LED T3 to the cathode of the LED T3 is opposite to the direction from the anode of the LED T4 to the cathode of the LED T4, so the line structure LS between the LEDs T1-T4 can still be used to provide the reference voltage to the cathodes of the LEDs T1-T4. It should be noted that the line structure LS', the line L3', and the line L4' and their positions in the embodiment of FIG. 3B are changed to match the polarities of the LEDs T3 and T4 and thus are different from the line structure LS, the line L3, and the line L4 in the embodiment of FIG. 3A.

Figure 3C:
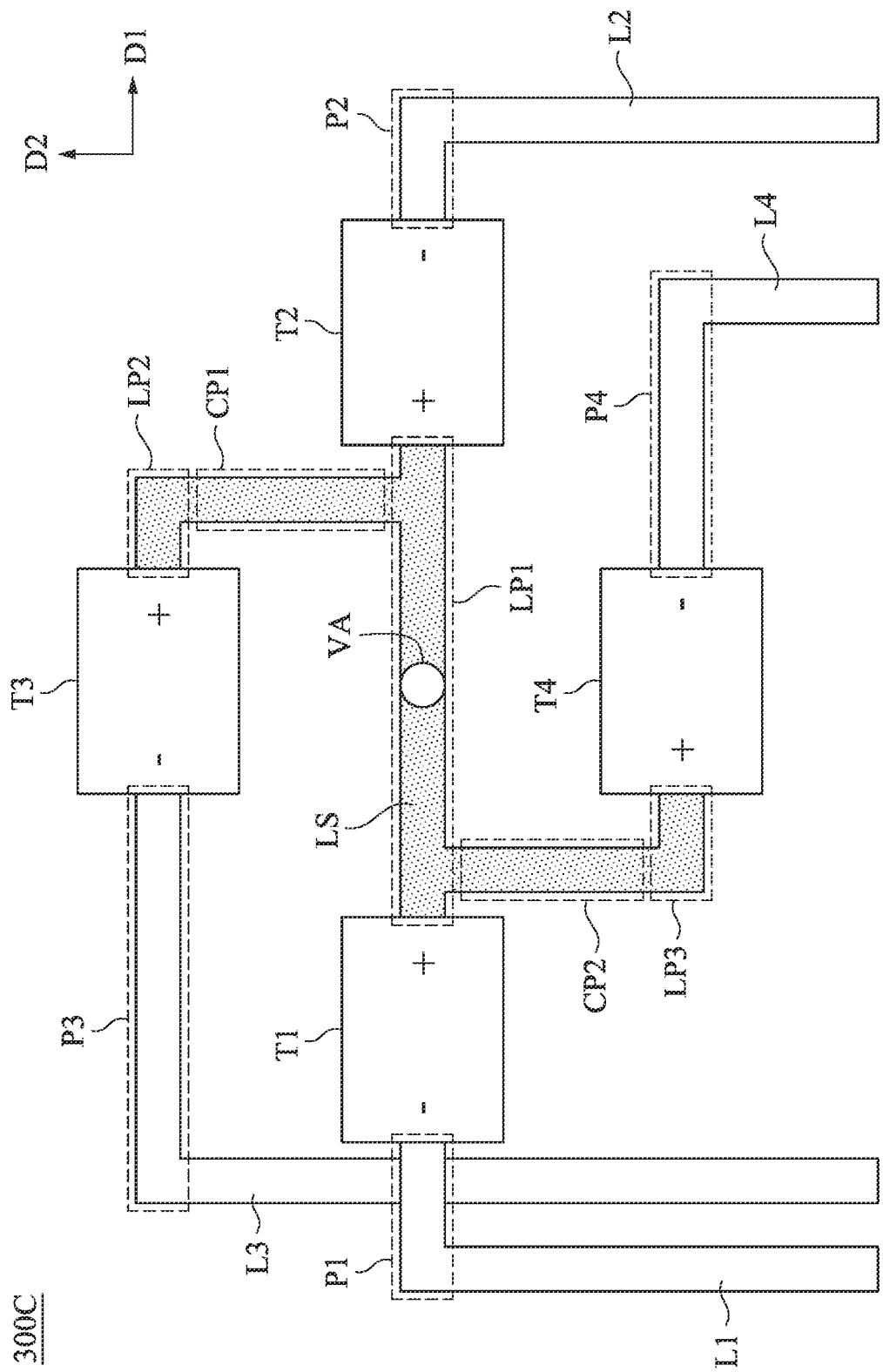
FIG. 3C is a diagram of a light emitting unit in a display device in accordance with some embodiments of the present disclosure.

As described above, the embodiment in FIG. 3A is a common-cathode structure. In an alternative embodiment, one or more of the technical features described above can be encompassed in a display device having a common-anode structure. Please refer to FIG. 3C. FIG. 3C is a diagram of a light emitting unit 300C in a display device in accordance with some embodiments of the present disclosure. The light emitting unit 300C has components that are similar to the ones that the light emitting unit 300A has. These components include the LEDs T1-T4, the line structure LS, and the lines L1, L2, L3, and L4. However, the polarities of the LEDs in the light emitting unit 300C are all opposite to the polarities of the LEDs in the light emitting unit 300A. In other words, the direction from the anode of the LED T1 to the cathode of the LED T1 and the direction from the anode of the LED T3 to the cathode of the LED T3 are opposite to the first direction D1, and the direction from the anode of the LED T2 to the cathode of the LED T2 and the direction from the anode of the LED T4 to the cathode of the LED T4 are the first direction DE In this embodiment, the line structure LS couples the anodes of the LEDs T1-T4 to the reference voltage through the connecting piece VA, the direction from the anode of the LED T1 to the cathode of the LED T1 is opposite to the direction from the anode of the LED T2 to the cathode of the LED T2, and the direction from the anode of the LED T3 to the cathode of the LED T3 is opposite to the direction from the anode of the LED T4 to the cathode of the LED T4. In addition, in one embodiment, the line segments LP1-LP3 and the connecting line segments CP1 and CP2 of the line structure LS are all arranged in the same layer of the PCB. Accordingly, one or more of the technical features described in previous embodiments can be implemented in the common-anode structure.

Figure 4A:
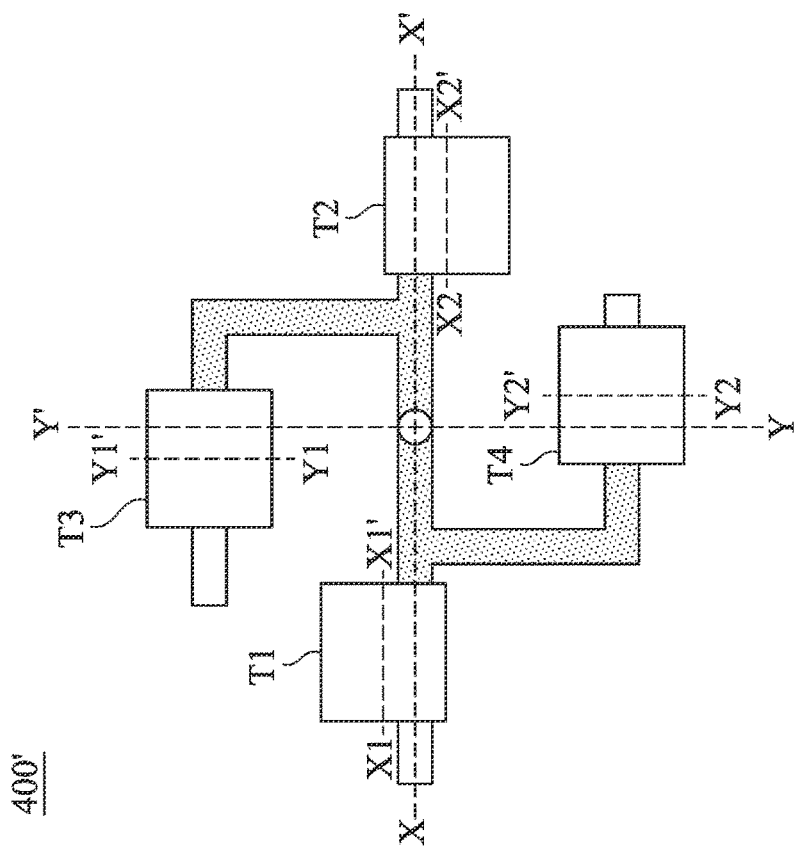
FIG. 4A is a diagram of a light emitting unit in a display device in accordance with some embodiments of the present disclosure.

Please refer to FIG. 4A. FIG. 4A is a diagram of a light emitting unit 400 in a display device in accordance with some embodiments of the present disclosure. The light emitting unit 400 has the structure and configuration similar to the light emitting unit 300A of FIG. 3A. In FIG. 4A, the LEDs T1 and T2 are aligned with each other. In other words, both of the middle lines of the LEDs T1 and T2 are line X-X'. The LEDs T3 and T4 are aligned with each other as well. In other words, both of the middle lines of the LEDs T3 and T4 are line Y-Y'.

Figure 4B:
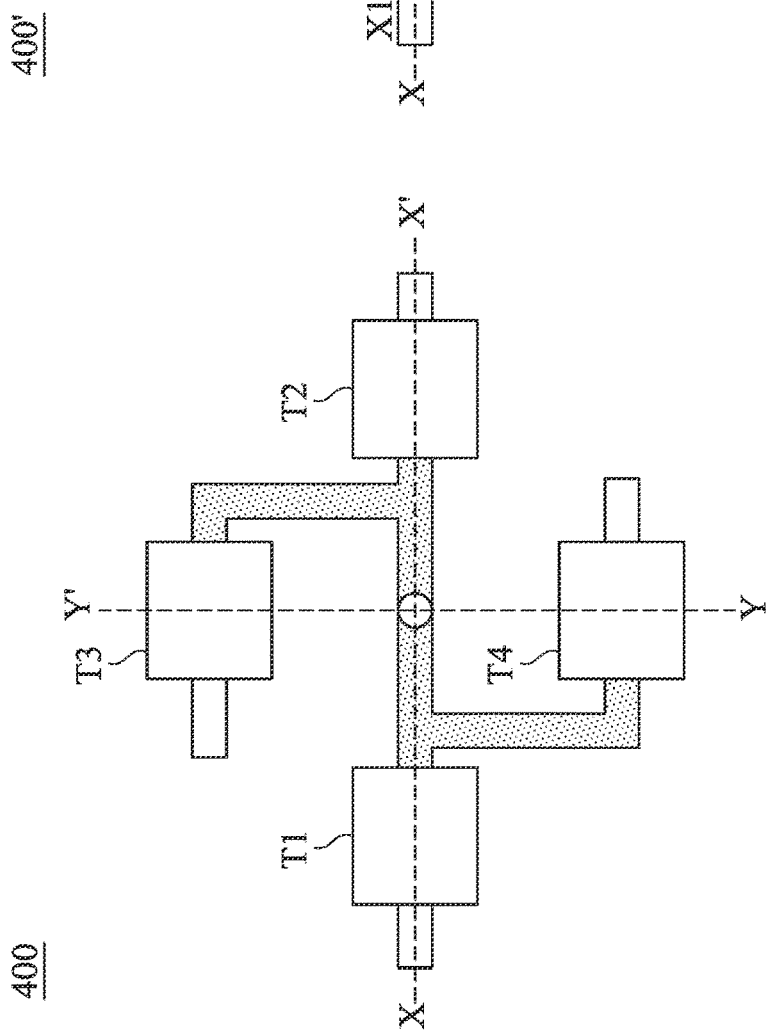
FIG. 4B is a diagram of a light emitting unit in a display device in accordance with some embodiments of the present disclosure.

In an alternative embodiment, the LEDs T1 and T2 are not aligned with each other, and the LEDs T3 and T4 are not aligned with each other. Please refer to FIG. 4B. FIG. 4B is a diagram of a light emitting unit 400' in a display device in accordance with some embodiments of the present disclosure. In FIG. 4B, a line X1-X1' is the middle line of the LED T1, a line X2-X2' is the middle line of the LED T2, a line Y1-Y1' is the middle line of the LED T3, and a line Y2-Y2' is the middle line of the LED T4. In one embodiment, the line X-X' shown in FIG. 4B is in parallel with the first direction D1 in the embodiment of FIG. 3A, and the line Y-Y' shown in FIG. 4B is in parallel with the second direction D2 in the embodiment of FIG. 3A. As shown in FIG. 4B, the lines X1-X1' and X2-X2' do not match the line X-X' and are on the different sides of the line X-X'. Similarly, the lines Y1-Y1' and Y2-Y2' do not match the line Y-Y' and are on the different sides of the line Y-Y'. In other words, the LEDs T1 and T2 deviate from the line X-X' that extends along the first direction D1, and the LEDs T3 and T4 deviate from the line Y-Y' that extends along the second direction D2. It should be noted that, in the embodiment of FIG. 4B, each of the LEDs T1-T4 of the light emitting unit 400' is connected to two lines that extend toward left and right respectively, so skewing during soldering can be avoided as well.

Figure 5:
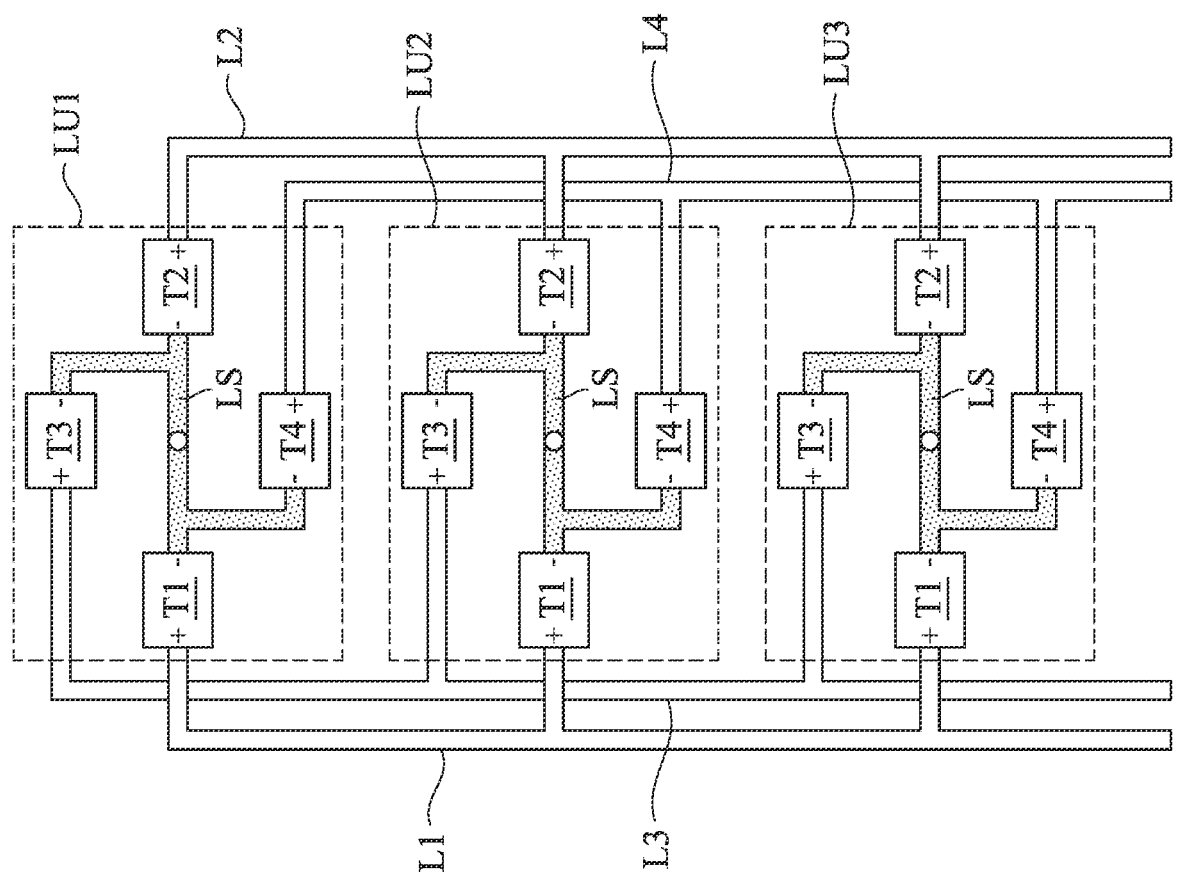
FIG. 5 is a diagram of a light emitting array in a display device in accordance with some embodiments of the present disclosure.

According to some embodiments of the present disclosure, the embodiments of FIGS. 3A, 3B, and/or 3C can be used to form an LED array. Please refer to FIG. 5. FIG. 5 is a diagram of a light emitting array 500 in a display device in accordance with some embodiments of the present disclosure. The light emitting array 500 includes light emitting units LU1-LU3 and lines L1-L4. It should be noted that, the number of these light emitting units is merely exemplary and should not be understood as limitation to the present disclosure, and different embodiments can have different number of light emitting units.

Each of the light emitting units LU1-LU3 has the LEDs T1-T4 and the line structure LS shown in the embodiment of FIG. 3A. In each light emitting unit, the LEDs T3, T4, T1, and T2 are respectively arranged at the up, down, left, and right positions in a plane, the line structure LS is coupled to the electrodes of the LEDs T1-T4, the electrodes have the same polarities, and the line structure LS includes the line segments LP1-LP3 and the connecting line segments CP1 and CP2 shown in the embodiment of FIG. 3A. For the clearness of FIG. 5, the line segments LP1-LP3 and the connecting line segments CP1 and CP2 are not shown in FIG. 5. Please refer to FIGS. 5 and 3A together. The line segment LP1 couples the LED T1 to the LED T2, the line segment LP2 is coupled to the LED T3, and the line segment LP3 is coupled to the LED T4. In one embodiment, the line segments LP1-LP3 of the line structure LS are arranged in the same layer. Relevant description of the embodiment in FIG. 3A can be referred to for details of FIG. 5.

As shown in FIG. 5, the line L1 couples the anodes of the LEDs T1 in the light emitting units LU1-LU3 with each other, the line L2 couples the anodes of the LEDs T2 in the light emitting units LU1-LU3 with each other, the line L3 couples the anodes of the LEDs T3 in the light emitting units LU1-LU3 with each other, and the line L4 couples the anodes of the LEDs T4 in the light emitting units LU1-LU3 with each other. In one embodiment, the lines L1 and L3 are arranged in different layers of the PCB. For example, in the embodiment of FIG. 5, the line L1 is arranged in a layer structure above the line L3. Similarly, in one embodiment, the lines L2 and L4 are arranged in different layers of the PCB. For example, in the embodiment of FIG. 5, the line L2 is arranged in a layer structure above the line L4. By this configuration, the lines L1-L4 are configured to receive relatively high voltages and transmit them to the anodes of the corresponding LEDs, so that the LEDs in the light emitting array 500 can emit light.

In one embodiment, as shown in FIG. 5, in every light emitting unit, the direction from the anode of the LED T1 to the cathode of the LED T1 is opposite to the direction from the anode of the LED T2 to the cathode of the LED T2, and the direction from the anode of the LED T3 to the cathode of the LED T3 is opposite to the direction from the anode of the LED T4 to the cathode of the LED T4.

It should be noted that, although the light emitting units LU1-LU3 of the light emitting array 500 in FIG. 5 uses the same configuration as the embodiment of FIG. 3A, the embodiments of FIG. 3B or 3C or other embodiments encompassed by the spirit of the present disclosure can be used in the light emitting array 500, and skewing of the LEDs when soldering can still be avoided.

In conclusion, by using lines extending toward left and right to connect the LEDs as described in the present disclosure, the LEDs can be prevented from skewing while soldering, and thus the yield rate of display devices can be improved. In addition, through the line structure located in the middle position and the features that the opposing LEDs have the opposite polarities as described in the present disclosure, the line structure can be simplified, and material used for lines and/or vias can be saved.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display device, comprising:
   a first light emitting diode;
   a second light emitting diode, arranged in a first direction corresponding to the first light emitting diode;
   a third light emitting diode;
   a fourth light emitting diode, arranged in a second direction corresponding to the third light emitting diode, the third light emitting diode and the fourth light emitting diode being arranged between the first light emitting diode and the second light emitting diode, wherein the second direction is different from the first direction;
   a line structure, comprising a first line segment, a second line segment, and a third line segment, wherein the first line segment extends along the first direction and couples the first light emitting diode to the second light emitting diode, the second line segment is coupled to the third light emitting diode, and the third line segment is coupled to the fourth light emitting diode;
   a first line, coupled to the first light emitting diode;
   a second line, coupled to the second light emitting diode;
   a third line, coupled to the third light emitting diode; and
   a fourth line, coupled to the fourth light emitting diode;
   wherein a portion of the first line and a portion of the second line are in parallel with the first line segment, a portion of the third line is in parallel with the second line segment, and a portion of the fourth line is in parallel with the third line segment.

2. The display device of claim 1, wherein:
   the line structure is coupled to electrodes of the first light emitting diode, the second light emitting diode, the third light emitting diode, and the fourth light emitting diode, the electrodes have the same polarities.

3. The display device of claim 1, wherein:
   the first line segment, the second line segment, and the third line segment are arranged in the same layer.

4. The display device of claim 1, wherein:
   an anode-to-cathode direction of the first light emitting diode is opposite to an anode-to-cathode direction of the second light emitting diode.

5. The display device of claim 4, wherein:
   an anode-to-cathode direction of the third light emitting diode is opposite to an anode-to-cathode direction of the fourth light emitting diode.

6. The display device of claim 1, wherein:
   an anode-to-cathode direction of the first light emitting diode and an anode-to-cathode direction of the third light emitting diode are the first direction.

7. The display device of claim 6, wherein:
   an anode-to-cathode direction of the second light emitting diode and an anode-to-cathode direction of the fourth light emitting diode are opposite to the first direction.

8. The display device of claim 1, further comprising:
   a connecting piece, configured to couple the first light emitting diode, the second light emitting diode, the third light emitting diode, and the fourth light emitting diode to a reference voltage.

9. The display device of claim 1, wherein:
   the line structure couples anodes of the first light emitting diode, the second light emitting diode, the third light emitting diode, and the fourth light emitting diode with each other.

10. The display device of claim 1, wherein:
    the line structure couples cathodes of the first light emitting diode, the second light emitting diode, the third light emitting diode, and the fourth light emitting diode with each other.

11. The display device of claim 1, wherein:
    the first light emitting diode and the second light emitting diode have a deviation in the first direction.

12. The display device of claim 1, wherein:
    the third light emitting diode and the fourth light emitting diode have a deviation in the second direction.

13. A display device, comprising:
    a plurality of light emitting units, each of the plurality of light emitting units comprising:
    a first light emitting diode, a second light emitting diode, a third light emitting diode, and a fourth light emitting diode, respectively arranged at up, down, left, and right positions in a plane, such that the plurality of light emitting units comprise first light emitting diodes, second light emitting diodes, third light emitting diodes, and fourth light emitting diodes; and
    a plurality of line structures, each of the plurality of line structures being coupled to electrodes of the first light emitting diode, the second light emitting diode, the third light emitting diode, and the fourth light emitting diode in a corresponding light emitting unit of the plurality of light emitting units, the electrodes having the same polarities, each of the plurality of line structures comprising:
    a first line segment, a second line segment, and a third line segment, wherein the first line segment couples the third light emitting diode to the fourth light emitting diode, the second line segment is coupled to the first light emitting diode, and the third line segment is coupled to the second light emitting diode;
    a first line, coupling the first light emitting diodes of the plurality of light emitting units with each other;
    a second line, coupling the second light emitting diodes of the plurality of light emitting units with each other;

a third line, coupling the third light emitting diodes of the plurality of light emitting units with each other; and a fourth line, coupling the fourth light emitting diodes of the plurality of light emitting units with each other.

14. The display device of claim 13, wherein:

an anode-to-cathode direction of the first light emitting diodes is opposite to an anode-to-cathode direction of the second light emitting diodes.

15. The display device of claim 14, wherein:

an anode-to-cathode direction of the third light emitting diodes is opposite to an anode-to-cathode direction of the fourth light emitting diodes.

16. The display device of claim 13, wherein:

the first line segment, the second line segment, and the third line segment of each of the plurality of line structures are arranged in the same layer.

17. The display device of claim 13, wherein:

the first line couples anodes of the first light emitting diodes of the plurality of light emitting units with each other;

the second line couples anodes of the second light emitting diodes of the plurality of light emitting units with each other;

the third line couples anodes of the third light emitting diodes of the plurality of light emitting units with each other; and the fourth line couples anodes of the fourth light emitting diodes of the plurality of light emitting units with each other.

18. The display device of claim 13, wherein:

the first line couples cathodes of the first light emitting diodes of the plurality of light emitting units with each other;

the second line couples cathodes of the second light emitting diodes of the plurality of light emitting units with each other;

the third line couples cathodes of the third light emitting diodes of the plurality of light emitting units with each other; and the fourth line couples cathodes of the fourth light emitting diodes of the plurality of light emitting units with each other.

19. The display device of claim 13, wherein:

the first line and the third line are arranged in different layers, and the second line and the fourth line are arranged in different layers.

20. The display device of claim 13, wherein:

the plurality of line structures is configured to transmit relatively low voltages to the first light emitting diodes, the second light emitting diodes, the third light emitting diodes, and the fourth light emitting diodes; and the first line, the second line, the third line, and the fourth line are configured to transmit relatively high voltages to the first light emitting diodes, the second light emitting diodes, the third light emitting diodes, and the fourth light emitting diodes.

* * * * *